United States Patent [19]

Muri et al.

[11] 4,213,185
[45] Jul. 15, 1980

[54] MICROPROCESSOR TONE SYNTHESIZER WITH REDUCED QUANTIZATION ERROR

[75] Inventors: David L. Muri, Lauderdale Lakes; James T. Doyle, Coral Springs, both of Fla.

[73] Assignee: Motorola, Inc., Schaumburg, Ill.

[21] Appl. No.: 943,037

[22] Filed: Sep. 18, 1978

[51] Int. Cl.² .................... G06F 1/02; H03B 19/00
[52] U.S. Cl. ........................ 364/721; 328/14; 364/703
[58] Field of Search ............... 364/703, 721; 328/14, 328/25, 30, 39, 41

[56] References Cited

U.S. PATENT DOCUMENTS

| | | | |
|---|---|---|---|
| 3,446,947 | 5/1969 | Overstreet, Jr. | 328/39 X |
| 3,787,836 | 1/1974 | Hagelbarger | 328/14 X |
| 3,946,321 | 3/1976 | Krolik | 328/25 |
| 3,982,199 | 9/1976 | Green | 328/39 X |
| 3,999,049 | 12/1976 | Roche et al. | 364/703 X |

Primary Examiner—David H. Malzahn
Attorney, Agent, or Firm—Margaret Marsh Parker; James W. Gillman

[57] ABSTRACT

The accuracy of a required tone set, digitally synthesized by a microprocessor, is improved beyond the theoretical limit of the microprocessor circuitry by producing each tone at a frequency which is a sub-multiple of the desired frequency, then multiplying to provide the desired frequency. With the addition of a multiplier such as a doubler, a better choice of oscillator frequency becomes possible which further increases the tone frequency accuracy. The microprocessor can also reduce the start up time and the time between tones, eliminating delays in transmitting a series of coded tones.

4 Claims, 6 Drawing Figures

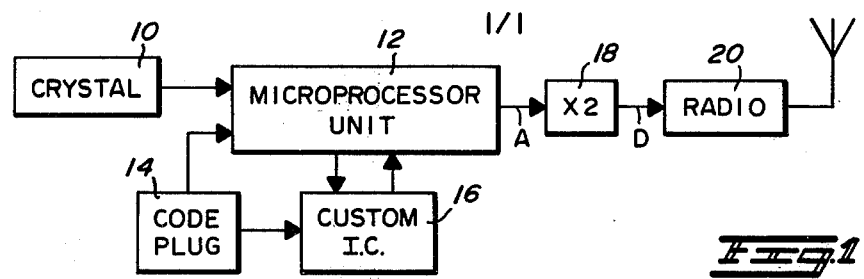
Fig. 1
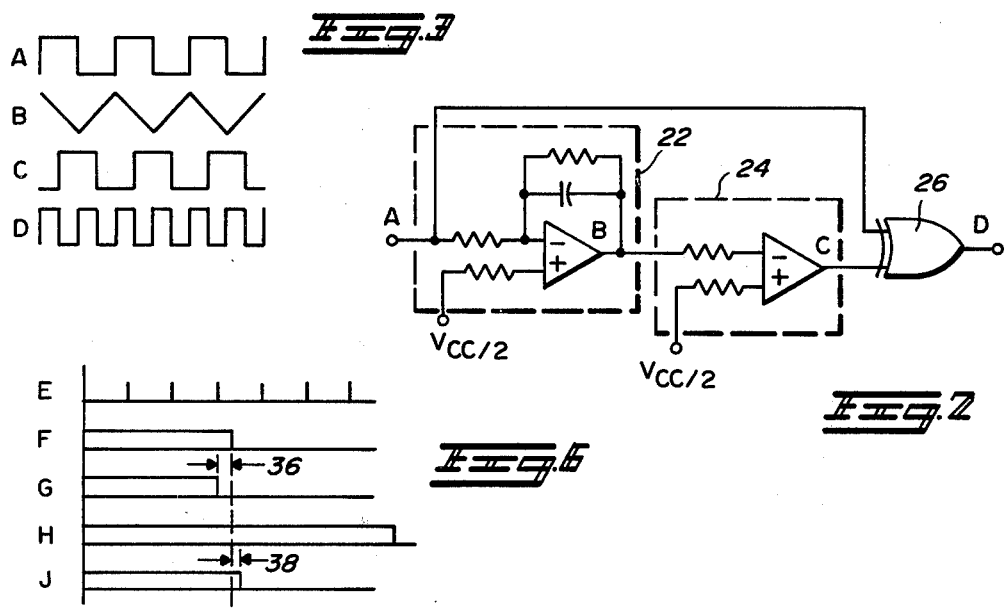
Fig. 3
Fig. 2
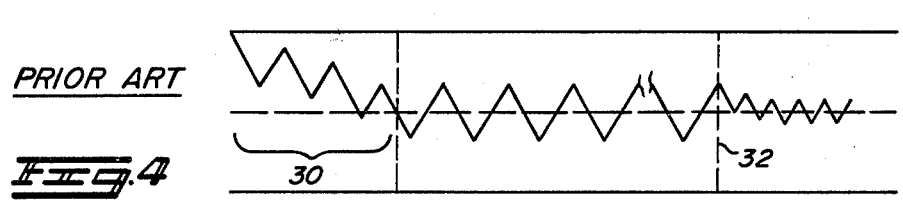
Fig. 6
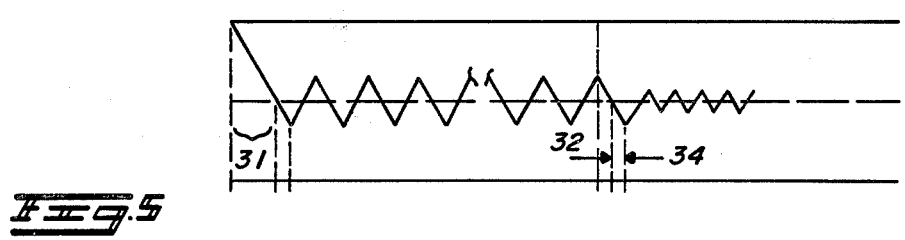
PRIOR ART
Fig. 4
Fig. 5

MICROPROCESSOR TONE SYNTHESIZER WITH REDUCED QUANTIZATION ERROR

BACKGROUND OF THE INVENTION

This invention relates to the field of tone synthesizers and more particularly to synthesizers such as are utilized in communications devices which must provide predetermined tone sets with great accuracy.

Tone synthesis is known to be achievable by programmed dividers coupled to a fixed signal source such as a crystal oscillator. Since such dividers in present day equipment are typically included in an IC, there is little flexibility to improve the accuracy of the tone set frequencies. Certain equipment requires the capability of changing from one set of tones to another; e.g. from ZVEI (Zentral-Verband der Electro-industrie) to CCIR (International Radio Consultative Committee or Comite' Consultatif International Radio) standard tones. While the CCIR standard calls for an accuracy of plus or minus 8 Hz, in some instances the required tones of the respective standards are as close as 5 Hz and have been distinguished at decoders solely by tone length which might be as long as 85 msec. for a CCIR tone of 1275 Hz or as short as 90 msec. for ZVEI tone of 1270 Hz. (ZVEI tone length is 70 msec±15 msec and CCIR tone length is 100 msec±10 msec.). Since the difference between the two tone lengths could be so slight, frequency accuracy becomes a critical requirement. Also, a more accurate encoder would reduce the system cost since narrow bandwidth (lower priced) decoders can be used.

Microprocessors have been used to provide tone synthesis and can overcome many of the problems of previous synthesizers. However, since the tones are produced by the addition of many increments, accuracy is limited by the size of the increment, which is a function of the oscillator frequency. Thus the accuracy is determined and limited by the frequency which is limited by the delay times of the specific circuitry.

SUMMARY OF THE INVENTION

It is therefore an object of the present invention to provide increased accuracy for tones synthesized by utilization of a microprocessor.

It is a particular object to provide this increased accuracy with a minimum of additional circuitry. These objects and others which will become apparent in the course of the following description are achieved in a synthesizer including a stable source of high frequency signals; i.e., several megahertz, and a source of signal codes such as a code plug. The high frequency signals provide clock signals for a logic circuit including a microprocessor which, following the signal codes, synthesizes signals with frequencies which are sub-multiples of the frequencies called for by the code plug. The synthesized signals are then multiplied to provide the required tone signals frequencies and these highly accurate tone signals are then utilized to frequency modulate a carrier signal.

BRIEF DESCRIPTION OF THE DRAWING

FIG. 1 of the drawing is a block diagram of a radio apparatus utilizing the present invention.

FIG. 2 is a logic diagram of a doubler circuit such as may be used in the invention.

FIG. 3 is a chart of the waveforms at designated points in the circuit of FIG. 2.

FIG. 4 is a chart of waveforms of the synthesized tone signals as in the prior art.

FIG. 5 is a chart of waveforms similar to that of FIG. 4 as in the present invention.

FIG. 6 is a timing chart illustrating the accuracy improvement due to the invention.

DETAILED DESCRIPTION OF A PREFERRED EMBODIMENT

For ease of understanding, the present invention will be shown and described in the environment of a communications apparatus as shown in the block diagram of FIG. 1 but the invention should not be construed as so limited.

The apparatus shown in FIG. 1 could be used for the transmission of coded tone signals, such as for paging purposes, and is shown here in incomplete form. A crystal 10 represents a crystal controlled oscillator, typically having a frequency of several megahertz, which is coupled to a microprocessor 12. A code plug 14 is coupled to the microprocessor 12 and to a custom IC 16. The code plug 14 is a source of data for the tone set of a particular signalling system such as the international codes ZVEI and CCIR or a system used within the United States. Each such code has a number of possible tones; e.g., there are 12 standard tones for the CCIR standard, ranging from 1124 to 2400 hertz.

An output of the microprocessor 12 is coupled to a multiplier 18 which will be further described with respect to FIGS. 2 and 3. While the multiplier 18 is indicated herein as a doubler circuit, it should be noted that other multiples than two could be used within the scope of the invention. The output of the multiplier 18 is coupled to a block labeled radio 20. The radio 20 represents the remainder of the transmitter including modulation stages, power output stages, antenna, etc.

The doubler circuit of FIG. 2 will be best understood in relation to the timing diagram of FIG. 3 which shows the waveforms at designated points in the circuit. Signal A of FIG. 3 represents any one of the synthesized tone signals which is one-half of a desired frequency and would appear at the output of the microprocessor 12. The signal A is coupled to an input of an integrator 22 which provides the signal B at its output point. Signal B is then coupled to an input of a zero crossing detector 24 which then has the signal C at its output. An EXCLUSIVE OR 26 has inputs coupled to receive the signal A and the signal C, thus the output of the EXCLUSIVE OR 26 is the signal D of FIG. 3, a double frequency signal. In one embodiment, the doubler circuit of FIG. 2 forms a part of the custom IC 16 of FIG. 1. The signal D is coupled to an input of the radio 20.

FIGS. 4 and 5 show an additional improvement to the encoded signal provided by the microprocessor. In the prior art of FIG. 4, the signal requires a reasonable start up time as indicated by time period 30 whereas the microprocessor can provide the very brief period required to integrate down to the $V_{cc}/2$ as indicated by time period 31 of FIG. 5. In each case the signal continues integrating for one-half period more, then integrates up and down with peak periods until the end of the tone at point 32. Again, at the beginning of the second tone, the microprocessor will allow only one-half period as indicated by time period 34 before the beginning of the second tone. Not only can a decoder lock on to the tone code faster, but less time is required between tones and between sets of coded tones. Only one period is lost between tones.

In FIG. 6 a highly simplified diagram or timing chart will help in an understanding of the advantage provided by the multiplier 18. In FIG. 6, the signal E represents the increments provided by the clock signals from the crystal 10. The signal F represents the period of a desired signal which is 3.33 of the clock period increments. Using the increments of signal E, the closest signal to the desired signal F which can be obtained is the signal G having a value 3.0 with an error of 0.33 increments indicated as interval 36. Signal H represents a signal having the period closest to the period of the signal F/2, which with the increments of signal E has a value 7.0. Multiplying the frequency of the signal H by 2 as in the multiplier 18, provides a signal J having a period of 3.5 increments, and an error interval 38 as compared to signal F of only 0.167 or half the error of signal F.

Not only can the error be reduced by half by utilizing sub-multiple frequencies and a subsequent multiplier, but with the new values, a new optimum frequency oscillator crystal can be chosen, with even greater accuracy achieved.

What is claimed is:

1. An encoder for use in communications apparatus and comprising in combination:

a stable signal source for supplying high frequency clock signals at a predetermined frequency;

a code source for supplying data signals representative of a predetermined set of tone codes;

synthesizer means coupled to the output of said stable signal source for receiving said clock signals, and coupled to the code source for receiving said tone code data signals and for providing first square wave signals at frequencies which are one-half of the frequencies called for by said tone codes;

multiplier means coupled to an output of the synthesizer means and comprising integrator means for integrating the first square wave signals, zero crossing detector means coupled to the output of the integrator means, logic gating means coupled to receive the output signals of the detector means and the first square waves for providing second square wave signals at the frequencies called for by said tone codes.

2. An encoder in accordance with claim 1 in which the stable signal source includes a crystal oscillator.

3. An encoder in accordance with claim 1 wherein the code source is an insertable, replaceable plug-in device.

4. An encoder in accordance with claim 1 wherein the tone synthesizer includes a microprocessor and wherein the synthesized tone periods are integral multiples of the periods of the stable signal source.

* * * * *